US011081379B2

(12) United States Patent
Reuter

(10) Patent No.: US 11,081,379 B2
(45) Date of Patent: Aug. 3, 2021

(54) LOAD PORT OPERATION IN ELECTRONIC DEVICE MANUFACTURING APPARATUS, SYSTEMS, AND METHODS

(71) Applicant: Applied Materials, Inc., Santa Clara, CA (US)

(72) Inventor: Paul B. Reuter, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/563,772

(22) Filed: Sep. 6, 2019

(65) Prior Publication Data

US 2019/0393065 A1 Dec. 26, 2019

Related U.S. Application Data

(63) Continuation of application No. 15/458,908, filed on Mar. 14, 2017, now Pat. No. 10,446,428.

(51) Int. Cl.
*H01L 21/677* (2006.01)
*H01L 21/673* (2006.01)

(52) U.S. Cl.
CPC .. *H01L 21/67772* (2013.01); *H01L 21/67389* (2013.01); *H01L 21/67775* (2013.01); *H01L 21/67393* (2013.01)

(58) Field of Classification Search
CPC ......... H01L 21/67389; H01L 21/67772; H01L 21/67775
See application file for complete search history.

(56) References Cited

U.S. PATENT DOCUMENTS

| 5,169,272 A | 12/1992 | Bonora et al. |
| 5,364,219 A | 11/1994 | Takahashi et al. |
| 5,697,750 A | 12/1997 | Fishkin et al. |
| 5,746,008 A | 5/1998 | Yamashita et al. |

(Continued)

FOREIGN PATENT DOCUMENTS

| JP | 2002357271 A | 12/2002 |
| JP | 2003060007 A | 2/2003 |

(Continued)

OTHER PUBLICATIONS

International Search Report and Written Opinion of the International Searching Authority for International Application No. PCT/US2018/016158 dated Jun. 26, 2018, 15 pages.

(Continued)

*Primary Examiner* — James Keenan
(74) *Attorney, Agent, or Firm* — Lowenstein Sandler LLP

(57) ABSTRACT

An electronic device manufacturing system may include a factory interface having a controlled environment. The electronic device manufacturing system may also include a load port coupled to the factory interface. The load port may be configured to receive a substrate carrier thereon and may include purge apparatus and a controller. The controller may be configured to operate the load port such that any air located around and between a substrate carrier door and the load port is at least partially or entirely purged, thus reducing or preventing contamination of the controlled environment upon the opening of the substrate carrier door by the load port. Methods of operating a factory interface load port are also provided, as are other aspects.

20 Claims, 7 Drawing Sheets

(56) References Cited

U.S. PATENT DOCUMENTS

| | | |
|---|---|---|
| 6,561,894 B1 | 5/2003 | Miyajima |
| 6,955,197 B2 | 10/2005 | Elliott et al. |
| 7,726,353 B2 | 6/2010 | Okabe |
| 8,356,526 B2 * | 1/2013 | Favre ............... H01L 21/67017 73/864.33 |
| 8,601,975 B2 | 12/2013 | Shah et al. |
| 8,689,812 B2 | 4/2014 | Shah et al. |
| 8,870,512 B2 | 10/2014 | Rice et al. |
| 9,153,468 B2 | 10/2015 | Emote et al. |
| 9,406,537 B2 | 8/2016 | Oyama et al. |
| 10,134,619 B2 | 11/2018 | Kondoh et al. |
| 10,159,169 B2 | 12/2018 | Vincent et al. |
| 10,262,884 B2 | 4/2019 | Bonecutter et al. |
| 10,586,723 B2 * | 3/2020 | Kawai ............... H01L 21/67201 |
| 2006/0225299 A1 | 10/2006 | Kim et al. |
| 2008/0069670 A1 | 3/2008 | Hashimoto et al. |
| 2008/0260498 A1 | 10/2008 | Nagata et al. |
| 2009/0110518 A1 | 4/2009 | Rice et al. |
| 2009/0169342 A1 | 7/2009 | Yoshimura et al. |
| 2012/0237323 A1 | 9/2012 | Sugawara |
| 2012/0241032 A1 | 9/2012 | Sugawara |
| 2015/0013771 A1 | 1/2015 | Quiles et al. |
| 2015/0045961 A1 | 2/2015 | Koshti et al. |
| 2015/0221538 A1 | 8/2015 | Ochiai et al. |
| 2016/0118279 A1 | 4/2016 | Iyer et al. |
| 2016/0147235 A1 | 5/2016 | Rice et al. |
| 2018/0124960 A1 | 5/2018 | Vincent et al. |
| 2018/0130684 A1 | 5/2018 | Reuter et al. |
| 2018/0130685 A1 | 5/2018 | Bonecutter et al. |
| 2018/0130686 A1 | 5/2018 | Blahnik et al. |
| 2018/0130687 A1 | 5/2018 | Bonecutter |
| 2018/0226284 A1 | 8/2018 | Blahnik |
| 2019/0189484 A1 | 6/2019 | Bonecutter et al. |

FOREIGN PATENT DOCUMENTS

| | | | |
|---|---|---|---|
| JP | 2012204645 A | 10/2012 | |
| KR | 10-2012-0109413 A | 10/2012 | |
| TW | 200744144 A1 | 12/2007 | |
| TW | 201240006 A1 | 12/2007 | |
| TW | M332528 A1 | 5/2008 | |
| WO | 201007657 | 1/2012 | |
| WO | WO-2017022431 A1 * | 2/2017 | ....... H01L 21/67393 |

OTHER PUBLICATIONS

Taiwan Search report of Taiwan Application No. 109110490 dated Nov. 2, 2020, 1 page.

Taiwan Search report of Taiwan Application No. 107103220 dated Apr. 17, 2019, 1 page.

* cited by examiner

LOAD PORT OPERATION IN ELECTRONIC DEVICE MANUFACTURING APPARATUS, SYSTEMS, AND METHODS

RELATED APPLICATIONS

The present application is a continuation application of U.S. patent application Ser. No. 15/458,908, filed Mar. 14, 2017, which is incorporated by reference herein.

FIELD

This disclosure relates to electronic device manufacturing and, more particularly, to factory interface load port operation.

BACKGROUND

Processing of substrates in semiconductor electronic device manufacturing is generally carried out in multiple process tools, where substrates travel between process tools in substrate carriers. Substrate carriers may be sealable containers carrying from one to, e.g., 25 substrates, and may be, e.g., Front Opening Unified Pods or FOUPs. A substrate carrier may be docked to a load port, which may be mounted to a factory interface, such as, e.g., an Equipment Front End Module or EFEM. The factory interface may be coupled to a process tool and may include a robot substrate handler operable to transfer substrates between a substrate carrier and the process tool.

An environmentally-controlled atmosphere may be provided within and between the substrate carrier, the factory interface, and the process tool. That is, because exposure to, e.g., air (particularly oxygen, a reactive gas) and moisture may adversely affect substrate properties and substrate processing due to oxidation, substrates may be kept in a non-reactive gas environment. A non-reactive gas may be, e.g., nitrogen. Any leakage in that environment occurring during, e.g., a transfer of substrates from a substrate carrier to a factory interface via a load port may accordingly contaminate substrates being processed and/or adversely affect processes being performed on the substrates. This may result in the manufacture of defective electronic devices on those substrates. Existing electronic device manufacturing systems may therefore benefit from improved load port operation that reduces or eliminates such leakage.

SUMMARY

According to a first aspect, a load port of a factory interface of an electronic device manufacturing system is provided. The load port comprises purge apparatus, a docking tray, a backplane located adjacent to the docking tray, a carrier door opener configured to seal an opening in the backplane when the carrier door opener is closed, and a controller coupled to operate the purge apparatus, the docking tray, and the carrier door opener. The controller is configured to purge a substrate carrier placed on the docking tray, dock the substrate carrier to the docking tray, activate a purge of an area around and between a substrate carrier door and the carrier door opener for a period of time, deactivate the purge of the area in response to expiry of the period of time, and clamp the substrate carrier to the backplane in response to deactivating the purge of the area.

According to a second aspect, an electronic device manufacturing system is provided. The electronic device manufacturing system comprises a substrate process tool and a factory interface. The factory interface comprises a housing having a front side and a rear side, the front side having a front side opening and the rear side coupled to the substrate process tool. The electronic device manufacturing system also comprises a load port configured to interface with a substrate carrier. The load port comprises a backplane coupled to the front side at the front side opening. The backplane has a backplane opening. The load port also comprises a docking tray and a carrier door opener. The carrier door opener seals the backplane opening when the carrier door opener is closed and opens a substrate carrier door of the substrate carrier. The electronic device manufacturing system further comprises a controller configured to purge the substrate carrier placed on the docking tray, dock the substrate carrier to the docking tray, activate a purge of an area around and between the substrate carrier door and the carrier door opener for a period of time, deactivate the purge of the area in response to expiry of the period of time, and clamp the substrate carrier to the backplane in response to deactivating the purge of the area.

According to a third aspect, a method of operating a factory interface load port in an electronic device manufacturing system is provided. The method comprises purging a substrate carrier placed on a load port docking tray, docking the substrate carrier to the load port docking tray, activating a purge of an area around and between a substrate carrier door of the substrate carrier and a carrier door opener of the load port for a period of time, deactivating the purge of the area between the substrate carrier door and the carrier door opener in response to expiry of the period of time, and clamping the substrate carrier against a backplane of the load port in response to the deactivating.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF DRAWINGS

The drawings, described below, are for illustrative purposes only and are not necessarily drawn to scale. The drawings are not intended to limit the scope of the disclosure in any way.

DETAILED DESCRIPTION

Figure 1:
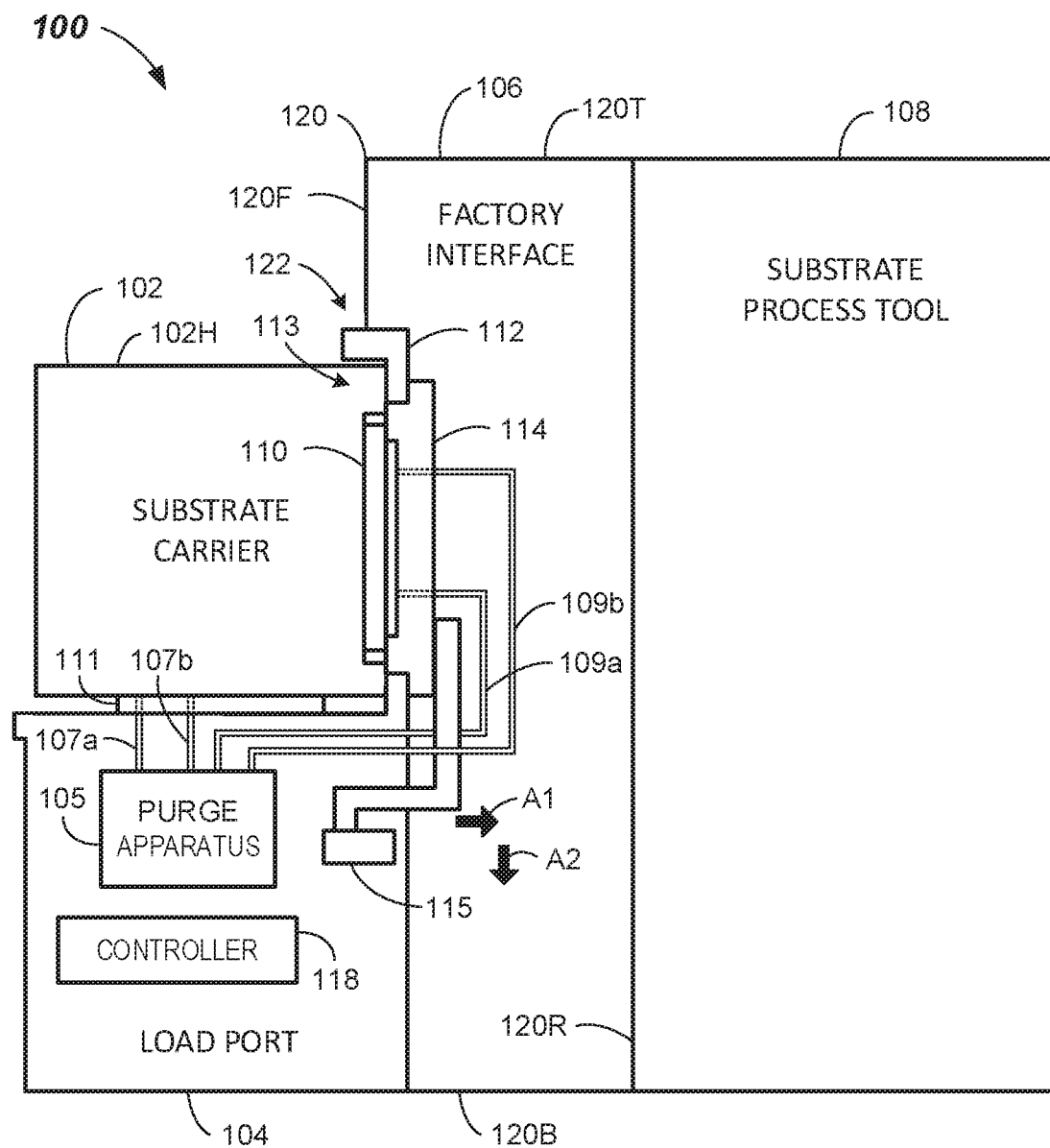
FIG. 1 illustrates a side schematic view of an electronic device manufacturing system according to embodiments of the disclosure.

Reference will now be made in detail to example embodiments of the disclosure, which are illustrated in the accompanying drawings. Wherever possible, the same reference numbers will be used throughout the drawings to refer to the same or like parts.

Electronic device manufacturing systems may provide controlled environments between various components, such as, e.g., substrate carriers, load ports, factory interfaces, and process tools, in order to reduce or eliminate, e.g., undesirable oxygen, moisture, and/or particles that may adversely affect substrate properties and/or substrate processing. A controlled environment may be, e.g., a positive-pressure non-reactive gas environment, wherein nitrogen, e.g., may be used as the non-reactive gas.

A load port operation may be performed to allow transfer of one or more substrates from a substrate carrier into a factory interface. A load port operation may include the following: receiving a substrate carrier on a load port docking tray, purging the substrate carrier of air (i.e., oxygen) and moisture by flowing a non-reactive gas, such as, e.g., nitrogen, into the substrate carrier, docking the substrate carrier to the docking tray, clamping the substrate carrier to a backplane of the load port to squeeze the substrate carrier against the backplane, attaching a load port carrier door opener located at the backplane to a substrate carrier door, purging a space between the carrier door opener and the substrate carrier door by flowing, e.g., nitrogen into that space (this purge may be referred to hereinafter as a "door purge"), and opening the substrate carrier door with the carrier door opener to allow transfer of one or more substrates from the substrate carrier into the factory interface and then into a process tool.

However, in some electronic device manufacturing systems, such a load port operation may result in contamination of a controlled factory interface environment. The contamination may be caused by air (i.e., oxygen), moisture, and/or particles contained therein that may be trapped in spaces around the substrate carrier door that are inaccessible during the door purge. The trapped air may then be released upon opening of the substrate carrier door, thus contaminating the factory interface environment.

In some electronic device manufacturing systems, variations of the above load port operation may also result in air and/or particle contamination of the factory interface environment for the same reasons as described above. For example, performing the door purge before the docking of the substrate carrier may cause an increase in pressure between the substrate carrier door and the carrier door opener, which may push open the carrier door opener and allow air (i.e., oxygen), moisture, and/or particles to contaminate the factory interface environment. Similarly, attaching the load port carrier door opener to the substrate carrier door after docking and then performing the door purge before clamping the substrate carrier to the backplane of the load port may still result in air and/or particle contamination of the factory interface environment for the same reasons as described above.

To address these contamination issues, electronic device manufacturing systems in accordance with one or more embodiments of the disclosure may include improved factory interface load ports and/or improved load port operation. The improved load ports may include a controller configured to perform a load port operation such that some or all of any air (and some or all of any undesirable particles contained therein) that may otherwise be trapped in spaces around a substrate carrier door may be purged before the substrate carrier door is opened. This may allow the controlled factory interface environment to be maintained at an acceptable level during a load port operation.

Further details of example embodiments illustrating and describing improved factory interface load ports in electronic device manufacturing systems, as well as other aspects including methods of operating a factory interface load port in an electronic device manufacturing system, will be explained in greater detail below in connection with FIGS. 1-5.

FIG. 1 illustrates a side schematic view of an electronic device manufacturing system 100 in accordance with one or more embodiments. Electronic device manufacturing system 100 may include a substrate carrier 102, a load port 104, a factory interface 106, and a substrate process tool 108. Load port 104 may be coupled to factory interface 106, which may be coupled to substrate process tool 108. Electronic device manufacturing system 100 may include other components as well.

Substrate carrier 102 may be a sealable container configured to carry one or more substrates. Substrates may be any suitable article used to make electronic devices or circuit components, such as silicon-containing discs or wafers, patterned wafers, glass plates, or the like. Substrate carrier 102 may be, e.g., a Front Opening Unified Pod or FOUP in some embodiments, and may include a substrate carrier door 110. In some embodiments, substrate carrier door 110 may be a FOUP door.

Load port 104 may include a docking tray 111 and a backplane 112 located adjacent to docking tray 111. Docking tray 111 may be configured to receive substrate carrier 102 thereon, and backplane 112 may have a backplane opening 113 configured to receive substrate carrier 102 and substrate carrier door 110 therein.

Figure 1A:
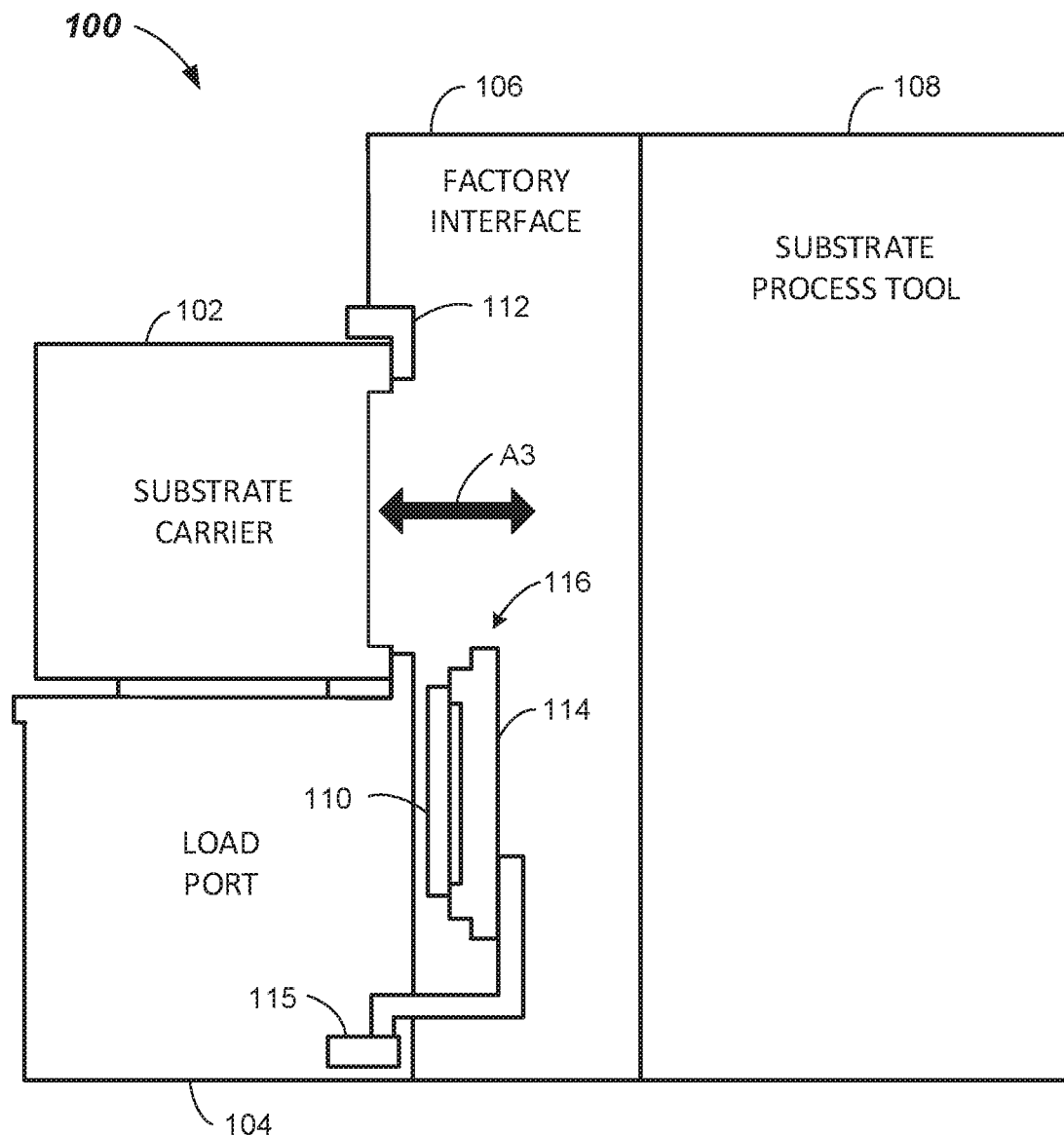
FIG. 1A is a simplified version of FIG. 1 illustrating a substrate carrier door and a carrier door opener in an open position according to embodiments of the disclosure.

Load port 104 may also have a carrier door opener 114 configured to attach to, unlatch, and open substrate carrier door 110 to allow the transfer of substrates into and out of substrate carrier 102. More particularly, carrier door opener 114 may open substrate carrier door 110 by attaching to and unlatching substrate carrier door 110, moving substrate carrier door 110 inward (i.e., to right as represented by arrow A1) until backplane 112 is cleared, and then moving substrate carrier door 110 downward (as represented by arrow A2) into an open position via an elevator mechanism 115 that may move along a rail or like structure (not shown). FIG. 1A illustrates electronic device manufacturing system 100 (although not all features are shown and/or labelled in FIG. 1A) having substrate carrier door 110 and carrier door opener 114 in an open position 116 in accordance with one or more embodiments. Open position 116 may allow one or more substrates to be transferred into and out of substrate carrier 102, as represented by double-headed arrow A3.

Load port 104 may also include purge apparatus 105, a first inlet gas flow line 107a, a first outlet gas flow line 107b, a second inlet gas flow line 109a, and a second outlet gas flow line 109b. Purge apparatus 105 may be configured to provide an environmentally-controlled atmosphere, such as, e.g., a positive-pressure non-reactive and/or inert gas environment or the like. Purge apparatus 105 may include one or more valves, gas flow lines, pumps, flow controllers, flow meters, connections to external equipment and/or gas supplies/sources, etc. (none shown). In some embodiments, purge apparatus 105 may include additional or alternative equipment. First inlet gas flow line 107a and first outlet gas flow line 107b may each be connected to purge apparatus 105 and may each extend from purge apparatus 105 through docking tray 111 for connection to substrate carrier 102 to allow substrate carrier 102 to be purged (e.g., to allow a non-reactive gas to fill substrate carrier 102). Second inlet gas flow line 109a and second outlet gas flow line 109b may each be connected to purge apparatus 105 and may each extend from purge apparatus 105 through carrier door opener 114 to allow a door purge to be performed (e.g., to allow a non-reactive gas to fill spaces around and between substrate carrier door 110 and carrier door opener 114). In some embodiments, first inlet gas flow line 107a, first outlet gas flow line 107b, second inlet gas flow line 109a, and/or second outlet gas flow line 109b may each be made of flexible material (e.g., to allow carrier door opener 114 to open without disconnecting gas flow line connections to purge apparatus 105 and/or carrier door opener 114).

Load port 104 may further include a controller 118 that may be coupled to each of the active components of load port 104 to control operation thereof. In some embodiments, the active components may include purge apparatus 105, docking tray 111, and carrier door opener 114 (along with elevator mechanism 115) Controller 118 may include a programed processor and memory storing processor executable instructions.

Factory interface 106 may be any suitable enclosure having a housing 120 that has a front side 120F, a rear side 120R, a top 120T, a bottom 120B, and two side walls (not separately shown). Front side 120F may have one or more front side openings 122 configured to receive and couple to a respective load port 104. Factory interface 106 may include a robot substrate handler (not shown) configured to transfer substrates from substrate carrier 102 through factory interface 106 to substrate process tool 108. Factory interface 106 may be maintained in a positive-pressure non-reactive gas environment (using, e.g., nitrogen as the non-reactive gas) using equipment (e.g., gas supply lines, one or more gas supplies or sources, vacuum pumps, valves, etc.; not shown) located within and/or coupled to electronic device manufacturing system 100. Factory interface 106 may, in other embodiments, be maintained in other non-reactive and/or inert gas environments, under vacuum, or the like.

Substrate process tool 108 may perform one or more processes, such as, e.g., physical vapor deposition (PVD), chemical vapor deposition (CVD), etching, annealing, pre-cleaning, metal or metal oxide removal, or the like, on one or more substrates. Other processes may be carried out on substrates therein. Substrate process tool 108 may include one or more load lock chambers, a transfer chamber, and one or more process chambers (none shown). The one or more load lock chambers may be coupled to factory interface 106, while the transfer chamber may be coupled to the one or more load lock chambers and to the one or more process chambers. The robot substrate handler of factory interface 106 may transfer substrates into and out of the one or more load lock chambers. Substrate process tool 108 may include a transfer robot (not shown) at least partially housed within the transfer chamber. The transfer robot may be configured to transfer substrates to and from the one or more load lock chambers and the one or more process chambers. As in factory interface 106, substrate process tool 108 may be maintained in an environmentally-controlled atmosphere (e.g., in a positive-pressure non-reactive and/or inert gas environment, under vacuum or the like) using equipment (e.g., gas supply lines, one or more gas supplies or sources, vacuum pumps, valves, etc.; not shown) located within and/or coupled to electronic device manufacturing system 100.

Figure 2:
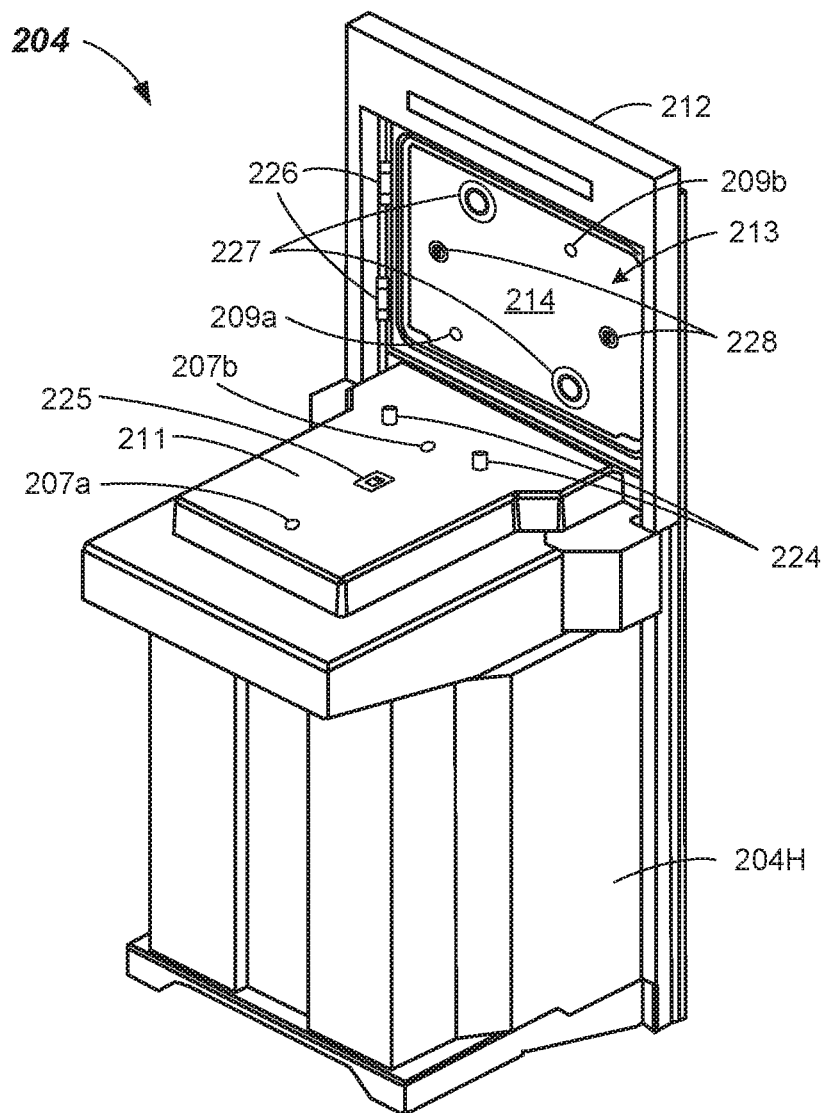
FIG. 2 illustrates a front perspective view of a load port according to embodiments of the disclosure.

FIG. 2 illustrates a front perspective view of a load port 204 in accordance with one or more embodiments. In some embodiments, load port 204 may be identical or similar to load port 104. Load port 204 may include a docking tray 211, a backplane 212 having a backplane opening 213, and a carrier door opener 214 that seals backplane opening 213 when carrier door opener 214 is closed against backplane 212 as shown in FIG. 2. In some embodiments, docking tray 211 may be identical or similar to docking tray 111 (FIG. 1), backplane 212 may be identical or similar to backplane 112 (FIG. 1), and carrier door opener 214 may be identical or similar to carrier door opener 114 (FIG. 1).

Docking tray 211 may be configured to receive thereon a substrate carrier, such as, e.g., substrate carrier 102. Docking tray 211 may have one or more positioning pins 224 extending upward from docking tray 211 that may be configured to cooperate with corresponding holes in a bottom of a substrate carrier to guide the substrate carrier into a proper position on docking tray 211. Although two positioning pins 224 are shown in FIG. 2, other embodiments may have more or less positioning pins 224. Docking tray 211 may also have a bottom clamp 225, which may be, e.g., a hook or claw-like device, configured to securely attach a substrate carrier to docking tray 211 via a corresponding feature located on the bottom of the substrate carrier. Docking tray 211 may further have a first purging inlet 207a and a first purging outlet 207b. In some embodiments, first purging inlet 207a and first purging outlet 207b may each include an appropriately oriented one-way valve. First purging inlet 207a may be configured to connect to purge apparatus 105 (FIG. 1) via first inlet gas flow line 107a, and first purging outlet 207b may be configured to connect to purge apparatus 105 via first outlet gas flow line 107b. Other embodiments may have more than one first purging inlet 207a and/or more than one first purging outlet 207b. In some embodiments, docking tray 211 may be configured to move toward backplane 212 from a substrate carrier placing/docking position to a clamping position, as described in more detail below in connection with FIGS. 4A and 4B.

Backplane 212 may include two or more side clamps 226 configured to clamp a substrate carrier to backplane 212. In the embodiment shown in FIG. 2, four side clamps 226 may be provided on backplane 212, two located on the left vertical side of backplane opening 213 (as shown) and two side clamps 226 located on the opposite right vertical side (not shown). After a substrate carrier has been placed on and docked to docking tray 211 and moved into the clamping position by docking tray 211, each side clamp 226 may be configured to engage and squeeze the substrate carrier against backplane 212.

Carrier door opener 214 may have one or more connectors 227 configured to contact and attach to substrate carrier door 110 of substrate carrier 102. Connectors 227 may be, e.g., suction pad or cup type devices coupled to a vacuum pump of load port 204 to create sufficient suction to securely attach carrier door opener 214 to substrate carrier door 110. Other suitable types of connector devices capable of attaching to carrier door 110 may be used.

Carrier door opener 214 may also have a second purging inlet 209a and a second purging outlet 209b. In some embodiments, second purging inlet 209a and second purging outlet 209b may each include an appropriately oriented one-way valve. Second purging inlet 209a may be configured to connect to purge apparatus 105 (FIG. 1) via second inlet gas flow line 109a, and second purging outlet 209b may be configured to connect to purge apparatus 105 via second outlet gas flow line 109b.

In some embodiments, substrate carrier 102 (FIG. 1) may have a locking or latching mechanism that secures substrate carrier door 110 to a substrate carrier housing 102H (FIG. 1). In one or more embodiments, carrier door opener 214 may have one or more latchkeys or latching mechanisms 228 configured to extend from carrier door opener 214 and connect to corresponding features in substrate carrier door 110 to unlatch or unlock (e.g., via clockwise or counterclockwise rotation), or otherwise enable substrate carrier door 110 to be opened.

Load port 204 may further include a housing 204H that may enclose purge apparatus (e.g., purge apparatus 105), a controller (e.g., controller 118), a substrate carrier door opening/closing mechanism (e.g., elevator mechanism 115 and related parts), and/or other equipment.

Figure 3:
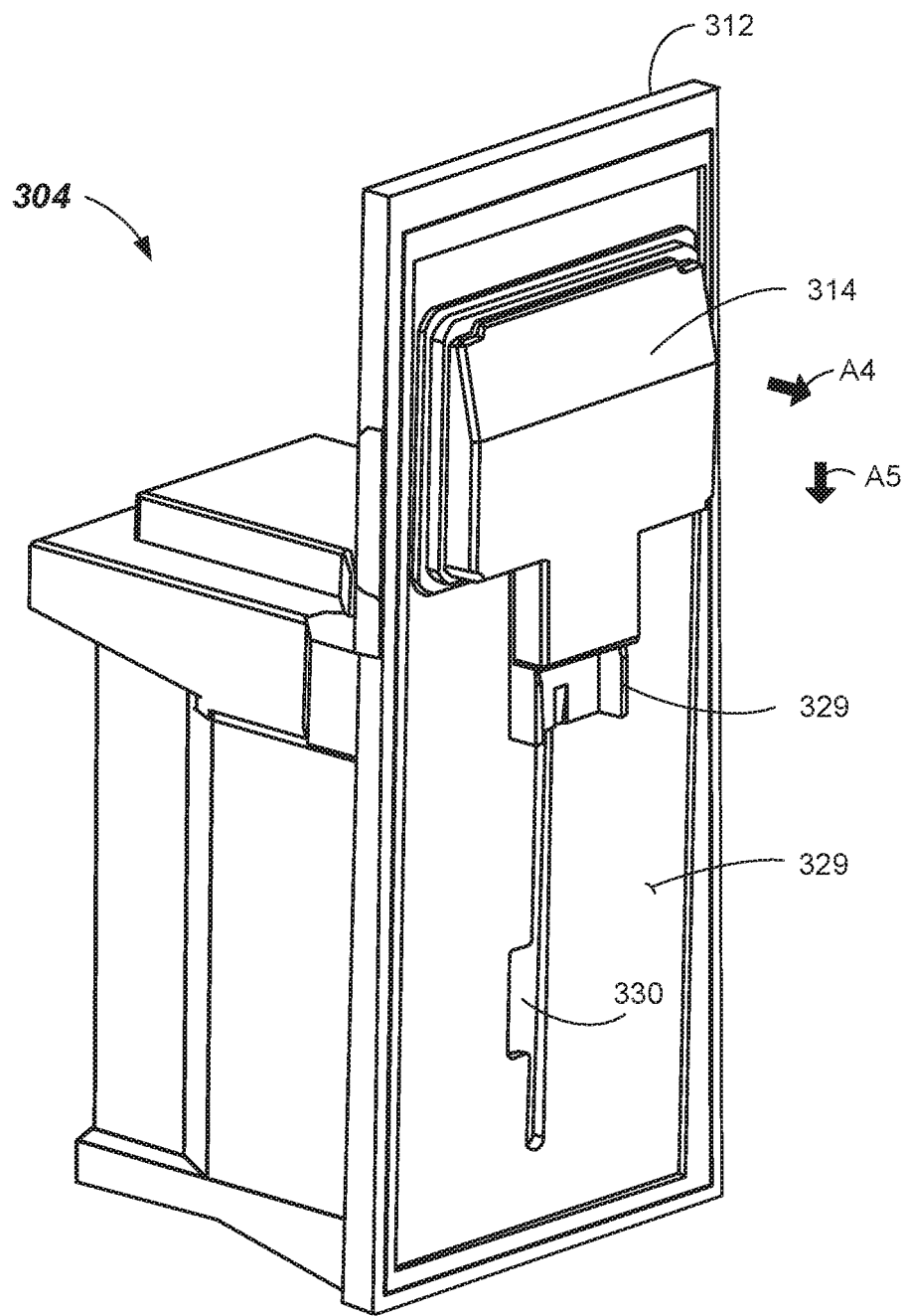
FIG. 3 illustrates a simplified rear perspective view of a load port according to embodiments of the disclosure.

FIG. 3 illustrates a simplified rear view of a load port 304 in accordance with one or more embodiments. In some embodiments, load port 304 may be identical or similar to load port 104 and/or 204. Load port 304 may include a backplane 312 and a carrier door opener 314 that seals a backplane opening (not shown in FIG. 3) when carrier door opener 314 is closed as shown. Carrier door opener 314 may be slightly larger than the backplane opening such that carrier door opener 314 may seal the backplane opening. Load port 304 may further include an elevator arm 329 coupled to an elevator mechanism, such as, e.g., elevator mechanism 115 (FIGS. 1 and 1A) via an elevator opening 330 through backplane 312. To open a substrate carrier door (such as substrate carrier door 110 of FIG. 1), carrier door opener 314 may attach to and unlatch the substrate carrier door as, e.g., described above in connection with connectors 227 and latching mechanisms 228 of FIG. 2, and move the substrate carrier door through and away from the backplane opening in the direction of arrow A4 and then downward below the backplane opening in the direction of arrow A5.

Figure 4A:
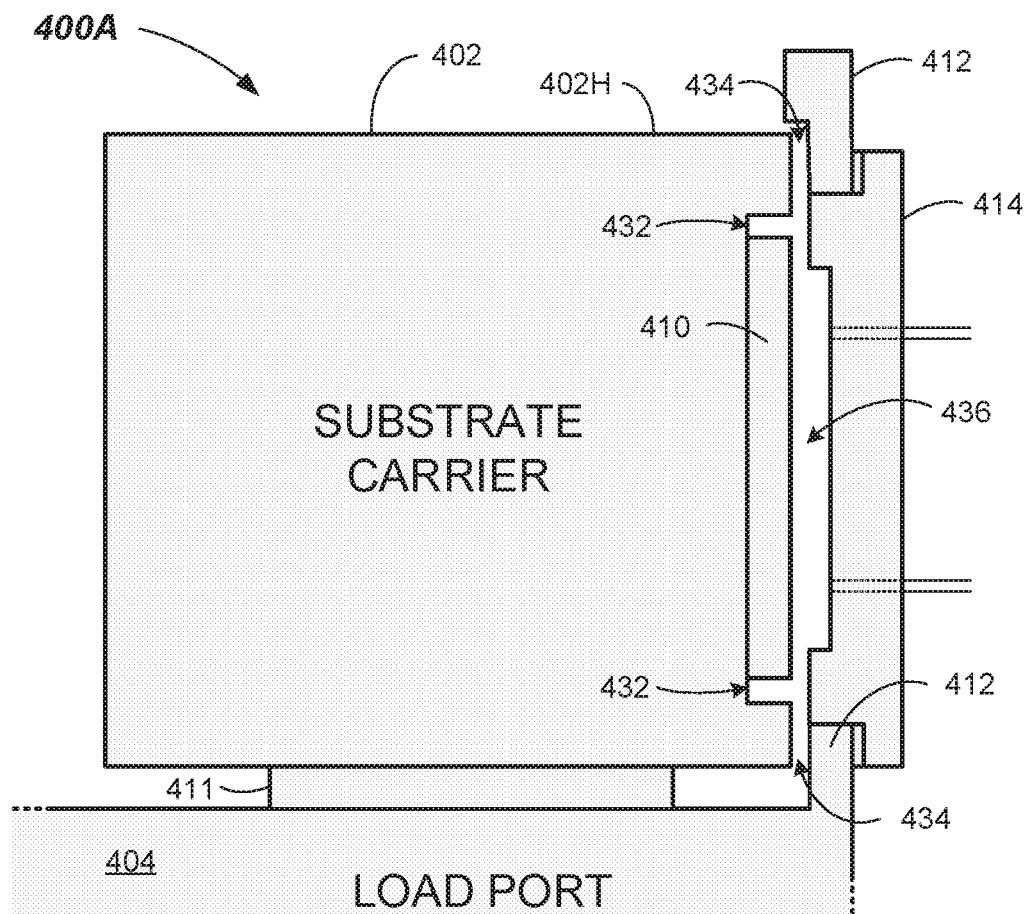
FIG. 4A illustrates a simplified side schematic view of a substrate carrier docked but not clamped to a load port relative to a carrier door opener of the load port according to embodiments of the disclosure.
Figure 4B:
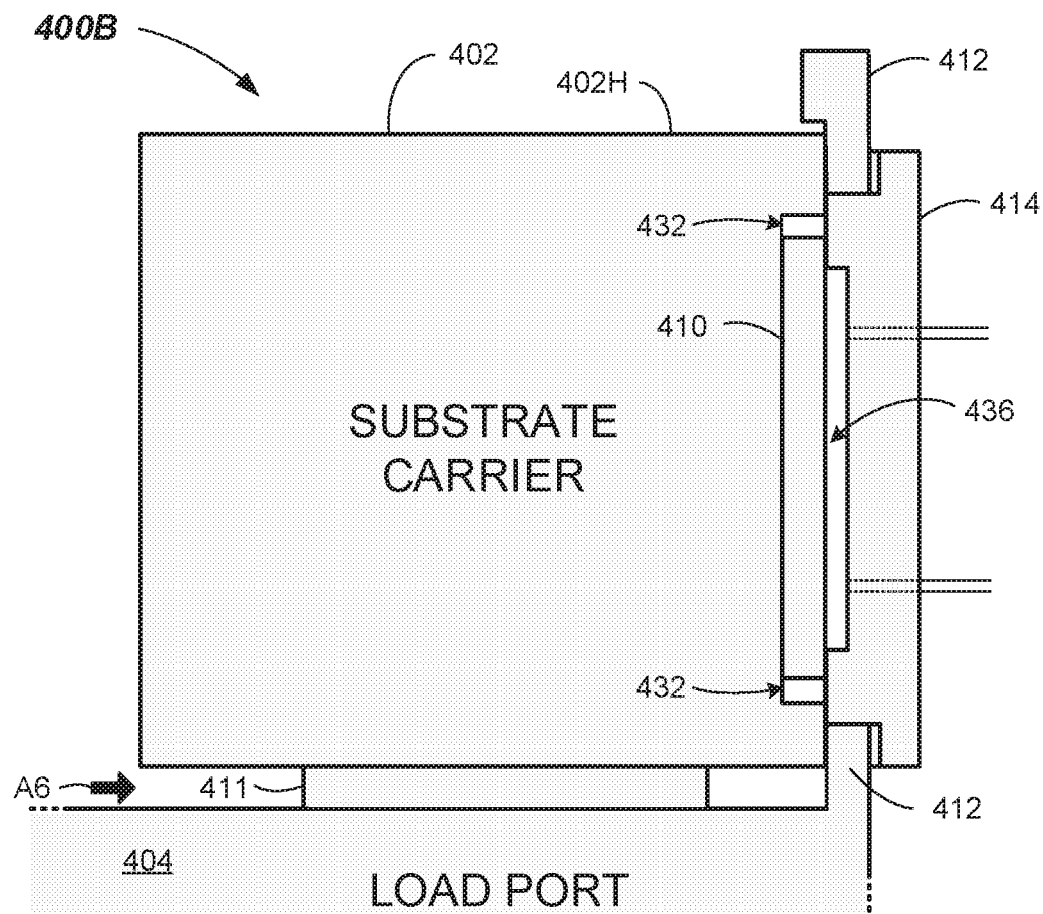
FIG. 4B illustrates a simplified side schematic view of a substrate carrier docked and clamped to a load port relative to a carrier door opener of the load port according to embodiments of the disclosure.

FIGS. 4A and 4B illustrate a substrate carrier 402 relative to a load port 404 during a load port operation in accordance with one or more embodiments. The load port operation may be carried out by a controller, such as, e.g., controller 118 (FIG. 1) executing programming instructions. Substrate carrier 402 may include a substrate carrier door 410 wherein, in some embodiments, substrate carrier 402 may be identical or similar to substrate carrier 102 (FIGS. 1 and 1A), and substrate carrier door 410 may be identical or similar to substrate carrier door 110 (FIGS. 1 and 1A). An annular space 432 may exist around substrate carrier door 410 and between substrate carrier door 410 and a housing 402H of substrate carrier 402.

Load port 404 may include a docking tray 411, a backplane 412, and a carrier door opener 414. In some embodiments, load port 404 may be identical or similar to load port 104, 204, and/or 304; docking tray 411 may be identical or similar to docking tray 111 and/or 211; backplane 412 may be identical or similar to backplane 112, 212, and/or 312; and carrier door opener 414 may be identical or similar to carrier door opener 114, 214, and/or 314.

FIG. 4A shows substrate carrier 402 in a placing/docking position 400A in accordance with one or more embodiments. That is, substrate carrier 402 may be placed on docking tray 411 via, e.g., placement on one or more positioning pins, such as, e.g., positioning pins 224 (FIG. 2). In some embodiments, substrate carrier 402 may then be docked to docking tray 411 via bottom-clamping of a bottom clamp (not shown), such as, e.g., bottom clamp 225 (FIG. 2), to a corresponding feature in or on a bottom of substrate carrier 402. As such, annular space 432 may be in fluid communication with a gap 434 between substrate carrier housing 402H and backplane 412/carrier door opener 414. Annular space 432 may also be in fluid communication with a space 436 between substrate carrier door 410 and carrier door opener 414.

FIG. 4B shows substrate carrier 402 in a clamped position 400B in accordance with one or more embodiments. That is, docking tray 411 may move docked substrate carrier 402 towards backplane 412 (in the direction of arrow A6) to allow two or more side clamps (not shown), such as, e.g., side clamps 226 (FIG. 2), to engage substrate carrier 402 and squeeze substrate carrier 402 against backplane 412 of load port 404. As a result, most or all of gap 434 no longer exists. While the portion of gap 434 between substrate carrier housing 402H and backplane 412 may no longer exist after the clamping, in some embodiments, a small gap (not shown) may still exist between substrate carrier door 410 and carrier door opener 414. This small gap may be closed upon attachment of carrier door opener 414 to substrate carrier door 410, as described in more detail below in connection with FIG. 5. As a result of the clamping, annular space 432 may either be no longer in fluid communication with gap 434 and space 436, or negligibly in fluid communication with a remaining portion of gap 434 and space 436. Accordingly, any air or other gas (and particles contained therein) that may have been present in annular space 432 may now be trapped therein.

Figure 5:
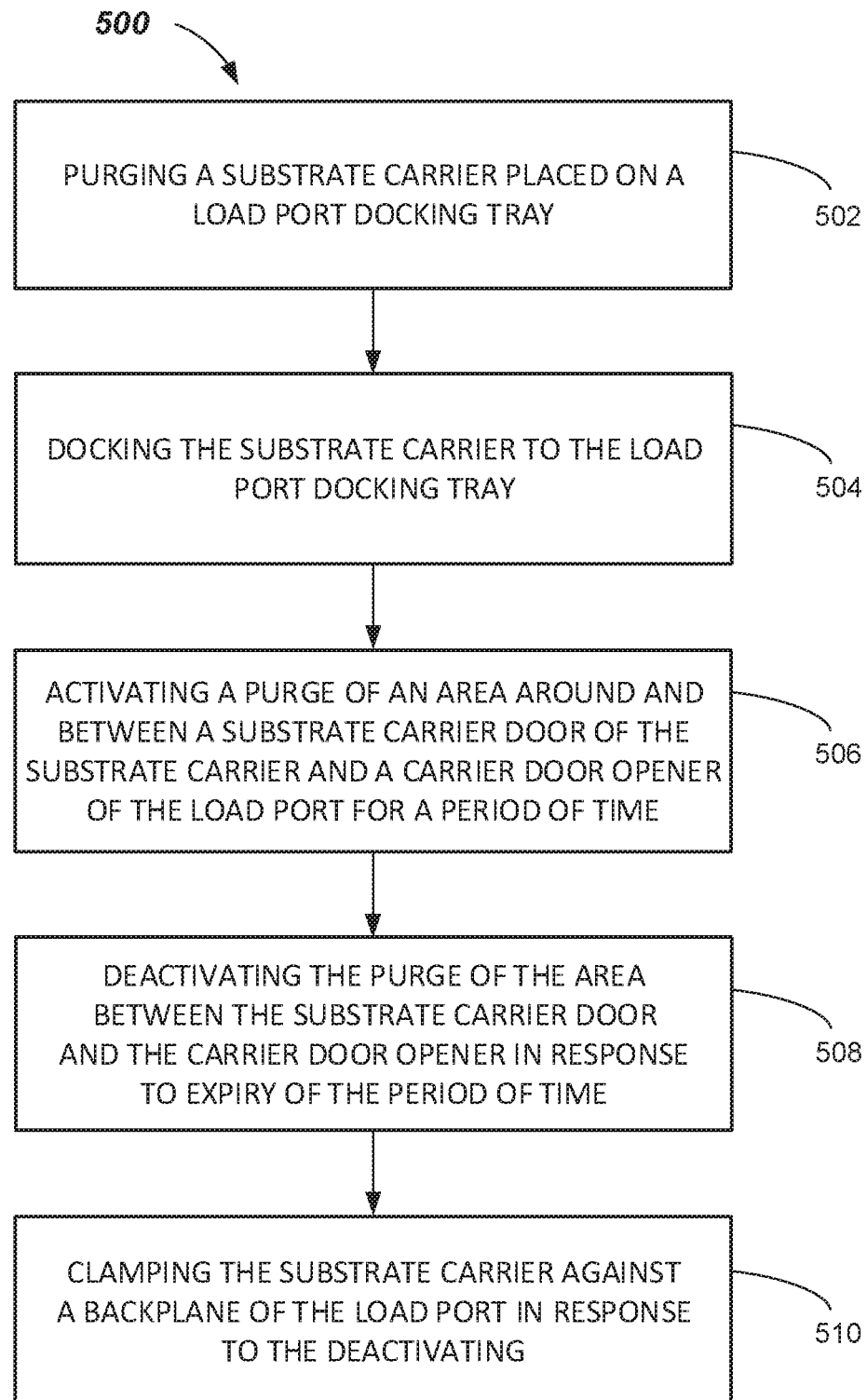
FIG. 5 illustrates a method of operating a factory interface load port in an electronic device manufacturing system according to embodiments of the disclosure.

FIG. 5 illustrates a method 500 of operating a factory interface load port in an electronic device manufacturing system in accordance with one or more embodiments. Method 500 may be performed by a controller, such as, e.g., controller 118 (FIG. 1) executing programming instructions. In some embodiments, method 500 may alternatively be performed by a system controller of an electronic device manufacturing system and/or by such a system controller in conjunction with a load port controller such as, e.g., controller 118.

At process block 502, method 500 may include purging a substrate carrier placed on a load port docking tray. A substrate carrier undergoing this purge may be placed in placing/docking position 400A as shown in FIG. 4A. More particularly, and referring to FIGS. 1 and 2 for example, substrate carrier 102 may be placed and properly positioned on docking tray 111 of load port 104 using positioning pins, such as, e.g., positioning pins 224. The proper positioning of substrate carrier 102 on docking tray 111 may align gas input and output ports located in a bottom of substrate carrier 102 with a first purging inlet (e.g., first purging inlet 207a of FIG. 2) and a first purging outlet (e.g., first purging outlet 207b of FIG. 2), respectively, of docking tray 111. Purge apparatus 105 may then purge substrate carrier with, e.g., a non-reactive gas such as nitrogen via first inlet gas flow line 107a and first outlet gas flow line 107b coupled respectively to the first purging inlet and the first purging outlet. In some embodiments, a purge flow rate may be used ranging from about 50 lpm (liters per minute) to about 95 lpm.

At process block 504, method 500 may include docking the substrate carrier to the load port docking tray. For example, while remaining in placing/docking position 400A (FIG. 4A), a bottom clamp, such as, e.g., bottom clamp 225 of docking tray 211 (FIG. 2) may be actuated to securely attach the substrate carrier to the docking tray via a corresponding feature located on the bottom of the substrate carrier.

At process block 506, method 500 may include activating a purge of an area around and between a substrate carrier door of the substrate carrier and a carrier door opener of the load port for a period of time. A substrate carrier undergoing this purge advantageously remains in placing/docking position 400A (FIG. 4A), as described below in more detail. Referring to FIGS. 1, 2, and 4A for example, purge apparatus 105 may purge the area around and between substrate carrier door 410 and carrier door opener 414, which may include annular space 432, gap 434, and space 436, which are all in fluid communication with each other. That area may be purged with, e.g., a non-reactive gas such as nitrogen via second inlet gas flow line 109*a* and second outlet gas flow line 109*b* coupled respectively to second purging inlet 209*a* and second purging outlet 209*b* of carrier door opener 214 (FIG. 2). In some embodiments, a purge flow rate may be used ranging from about 20 lpm (liters per minute) to about 65 lpm.

At process block 508, method 500 may include deactivating the purge of the area between the substrate carrier door and the carrier door opener in response to expiry of the period of time. In some embodiments, the period of time may range from about 20 seconds to about 120 seconds.

At process block 510, method 500 may include clamping the substrate carrier against a backplane of the load port after the deactivating of the purge of the area between the substrate carrier door and the carrier door opener. For example, referring to FIGS. 2 and 4B, the substrate carrier may be moved by docking tray 411 toward backplane 412 (FIG. 4B) to allow side clamps, such as, e.g., side clamps 226 (FIG. 2), to engage substrate carrier 402 and squeeze substrate carrier 402 against backplane 412 of load port 404.

After the clamping of the substrate carrier at process block 510, method 500 may further include attaching the carrier door opener to the substrate carrier door (by activating, e.g., a vacuum pump coupled to connectors 227 (FIG. 2), which may be suction pad type devices); unlatching the substrate carrier door by using, e.g., latching mechanisms 228 (FIG. 2); and opening the substrate carrier door with the carrier door opener as shown in FIG. 1A.

Referring back to process block 506, activating the purge of the area around and between the substrate carrier door and the carrier door opener while the substrate carrier is positioned at placing/docking position 400A (FIG. 4A) may significantly improve the effectiveness of the purge (that is, in removing any oxygen, moisture, and/or particles that may be in annular space 432, gap 434, and space 436). Because the second purging outlet and second outlet gas flow line (e.g., second purging outlet 209*b* and second outlet gas flow line 109*b*) may, in some embodiments, not be able to fully handle the resulting outflow during this purge, fluid communication with gap 434 allows at least some of the air (oxygen), moisture, and/or particles occupying annular space 432 to be purged therefrom by venting out through gap 434. The purge at process block 506 may be far less effective if performed after process block 510 (i.e., clamping the substrate carrier against a backplane of the load port), wherein most if not all of gap 434 no longer exists (see, e.g., FIG. 4B). The purge at process block 506 may also be far less effective if performed after the carrier door opener is attached to the substrate carrier door. Any air (oxygen), moisture, and/or particles trapped in annular space 432 may then contaminate the factory interface upon opening of the substrate carrier door with the carrier door opener.

The foregoing description discloses only example embodiments of the disclosure. Modifications of the above-disclosed apparatus, systems, and methods may fall within the scope of the disclosure. Accordingly, while example embodiments of the disclosure have been disclosed, it should be understood that other embodiments may fall within the scope of the disclosure, as defined by the following claims.

What is claimed is:

1. A load port of a factory interface of an electronic device manufacturing system comprising:
   a purge apparatus;
   a docking tray;
   a backplane located adjacent to the docking tray, the backplane comprising one or more clamps;
   a carrier door opener configured to seal an opening in the backplane when the carrier door opener is closed, the carrier door opener including an inlet gas line therethrough and an outlet gas line therethrough; and
   a controller configured to:
      cause the docking tray to securely attach a substrate carrier to the docking tray, the substrate carrier comprising a substrate carrier door and a substrate carrier housing, wherein securely attaching the substrate carrier to the docking tray comprises forming a gap between the substrate carrier housing and the backplane;
      cause the purge apparatus to purge at least one of a) a space between the substrate carrier door and the substrate carrier housing or b) an area between the substrate carrier door and the carrier door opener for a period of time via the inlet gas line, the outlet gas line, and the gap between the substrate carrier housing and the backplane;
      cause the purge apparatus to stop the purge of at least one of the space or the area in response to expiry of the period of time; and
      activate the one or more clamps to clamp the substrate carrier to the backplane in response to causing the purge apparatus to stop the purge of at least one of the space or the area, wherein clamping the substrate carrier to the backplane comprises closing the gap between the substrate carrier housing and the backplane.

2. The load port of claim 1, wherein the space between the substrate carrier door and the substrate carrier housing is an annular space.

3. The load port of claim 1, wherein the controller is configured to cause the purge apparatus to purge at least one of the space or the area while at least one of the space or the area is in fluid communication with the gap between the substrate carrier housing and the backplane.

4. The load port of claim 1, wherein the one or more clamps comprise one or more side clamps.

5. The load port of claim 1, wherein the controller is further configured to:
   activate the carrier door opener to attach to the substrate carrier door in response to the substrate carrier having been clamped to the backplane;
   activate a latching mechanism extending from the carrier door opener to unlatch the substrate carrier door after the carrier door opener is attached to the substrate carrier door; and
   activate the carrier door opener to open the substrate carrier door.

6. The load port of claim 5, wherein the controller is further configured to cause the carrier door opener to attach to the substrate carrier door by turning on a vacuum to one or more suction pad devices located on the carrier door opener.

7. The load port of claim 1, wherein the purge apparatus is enclosed in a load port housing supporting the docking tray, the purge apparatus comprising at least one of a valve, a pump, a gas flow line, a flow controller, or a flow meter.

8. The load port of claim 1, wherein the docking tray has a first purging inlet and a first purging outlet coupled to the purge apparatus, wherein the first purging inlet is to align to a gas input port in a bottom of the substrate carrier and the first purging outlet is to align to a gas output port in the bottom of the substrate carrier, and wherein the controller is further configured to:
cause the purge apparatus to purge the substrate carrier positioned on the docking tray in alignment with one or more positioning pins of the docking tray.

9. The load port of claim 8, wherein the controller is configured to sequentially: activate the purge apparatus to purge the substrate carrier, activate the docking tray to securely attach the substrate carrier to the docking tray; activate the purge apparatus to purge at least one of the space or the area for the period of time, deactivate the purge apparatus from the purge of at least one of the space or the area in response to expiry of the period of time; and activate the one or more clamps to clamp the substrate carrier to the backplane in response to deactivating the purge apparatus from the purge of at least one of the space or the area.

10. The load port of claim 1, wherein the inlet gas line comprises a first one-way valve and the outlet gas line comprises a second one-way valve.

11. An electronic device manufacturing system, comprising:
a factory interface comprising:
a housing having a front side and a rear side, the front side having a front side opening;
a load port configured to interface with a substrate carrier, the load port comprising:
a purge apparatus;
a docking tray;
a backplane coupled to the front side at the front side opening and comprising a backplane opening and one or more clamps; and
a carrier door opener configured to seal the backplane opening when the carrier door opener is closed and to open a substrate carrier door of a substrate carrier, wherein the carrier door opener includes an inlet gas line therethrough and an outlet gas line therethrough; and
a controller configured to:
activate the docking tray to securely attach the substrate carrier to the docking tray, wherein securely attaching the substrate carrier to the docking tray comprises forming a gap between the substrate carrier housing and the backplane;
activate the purge apparatus to purge at least one of a) a space between the substrate carrier door and a substrate carrier housing of the substrate carrier or b) an area between the substrate carrier door and the carrier door opener for a period of time via the inlet gas line, the outlet gas line, and the gap between the substrate carrier housing and the backplane;
deactivate the purge apparatus from the purge of at least one of the space or the area in response to expiry of the period of time; and
activate the one or more clamps to clamp the substrate carrier to the backplane in response to deactivating the purge apparatus from the purge of at least one of the space or the area, wherein clamping the substrate carrier to the backplane comprises closing the gap between the substrate carrier and the backplane.

12. The electronic device manufacturing system of claim 11, wherein the controller is further configured to activate the purge apparatus to purge the substrate carrier positioned on the docking tray in alignment with one or more positioning pins of the docking tray.

13. A method of operating a factory interface load port in an electronic device manufacturing system, the method comprising:
positioning a substrate carrier on a load port docking tray in alignment with positioning pins of the load port docking tray without any portion of the substrate carrier in contact with a backplane of the load port;
securely attaching the substrate carrier to the load port docking tray, the substrate carrier comprising a substrate carrier door and a substrate carrier housing, wherein securely attaching the substrate carrier to the load port docking tray comprises forming a gap between the substrate carrier housing and the backplane;
activating a purge of at least one of a) a space between the substrate carrier door and the substrate carrier housing or b) an area between the substrate carrier door and a carrier door opener for a period of time via an inlet gas line of the carrier door opener, an outlet gas line of the carrier door opener, and the gap between the substrate carrier housing and the backplane;
deactivating the purge of the area between the substrate carrier door and the carrier door opener in response to expiry of the period of time; and
clamping the substrate carrier against the backplane of the load port in response to the deactivating, wherein clamping the substrate carrier against the backplane comprises closing the gap between the substrate carrier housing and the backplane.

14. The method of claim 13, further comprising after the clamping:
attaching the carrier door opener to the substrate carrier door in response to the clamping;
unlatching the substrate carrier door with a latching mechanism extending from the carrier door opener; and
opening the substrate carrier door with the carrier door opener.

15. The method of claim 14, wherein the attaching comprises turning on a vacuum to one or more suction pad devices to attach the carrier door opener to the substrate carrier door.

16. The method of claim 13, further comprising:
purging the substrate carrier positioned on the load port docking tray after positioning the substrate carrier on the load port, wherein the purging comprises flowing an inert gas into the substrate carrier.

17. The method of claim 13, wherein securely attaching the substrate carrier to the load port docking tray comprises bottom-clamping the substrate carrier to the load port docking tray.

18. The method of claim 13, wherein activating the purge of the area between the substrate carrier door and the carrier door opener comprises flowing an inert gas into the area.

19. The method of claim 18, wherein the flowing comprises flowing the inert gas into the area via an inlet and an outlet in the carrier door opener.

20. The method of claim 13, wherein the clamping comprises engaging two or more side clamps of the load port with the substrate carrier to squeeze the substrate carrier against the backplane of the load port.

* * * * *